United States Patent [19]
Piret

[11] Patent Number: 4,747,104
[45] Date of Patent: May 24, 1988

[54] DATA TRANSMISSION SYSTEM EMPLOYING A COMBINATION OF BLOCK ENCODING AND CONVOLUTION ENCODING FOR ERROR PROTECTION

[75] Inventor: Philippe M. O. A. Piret, Lasne, Belgium

[73] Assignee: U.S. Philips Corporation, New York, N.Y.

[21] Appl. No.: 871,013

[22] Filed: Jun. 5, 1986

[30] Foreign Application Priority Data

Jun. 14, 1985 [EP] European Pat. Off. ........ 85200939.8

[51] Int. Cl.[4] ............................................. G06F 11/10
[52] U.S. Cl. ...................................... 371/39; 371/44
[58] Field of Search ................ 371/37, 39, 40, 43, 371/44, 45

[56] References Cited

U.S. PATENT DOCUMENTS

| | | | |
|---|---|---|---|
| 3,891,959 | 6/1975 | Tsuji et al. | 371/43 |
| 3,988,677 | 10/1976 | Fletcher et al. | 371/37 X |
| 4,038,636 | 7/1977 | Doland | 371/37 |
| 4,178,550 | 12/1979 | Acampora et al. | 371/37 |
| 4,240,156 | 12/1980 | Doland | 371/43 |
| 4,276,646 | 6/1981 | Haggard et al. | 371/37 |
| 4,355,392 | 10/1982 | Doi et al. | 371/43 X |
| 4,369,512 | 1/1983 | Brossard et al. | 371/43 |
| 4,536,878 | 8/1985 | Rattlingourd et al. | 371/43 |

*Primary Examiner*—Charles E. Atkinson
*Attorney, Agent, or Firm*—Thomas A. Briody; Jack Oisher

[57] ABSTRACT

A data transmission system for providing error protection of transmitted data words. The less significant bits of a data word are, by means of matrix multiplication, encoded into a first redundant proto-code word and the more significant bits are, by means of further matrix multiplication and delay by different word recurrence intervals encoded in a set of further redundant proto-code words. A composite of the proto-code word is formed by means of a modulo-2-addition of code words, so that for the less significant data bits a block code is realized, while for the more significant data bits a convolutional encoding is realized. In the decoding, the more significant bits of the composite code word are decoded by means of Viterbi decoding, the Viterbi metric being determined from the deviation between the reconstructed contribution of the less significant bits to such code word and the actually received contribution of such bits to such code word.

7 Claims, 3 Drawing Sheets

$$X' = \begin{pmatrix} 1 & 1 & 0 & 1 & 1 & 0 & 1 & 1 \\ 1 & 0 & 0 & 1 & 0 & 0 & 1 & 0 \end{pmatrix}$$

$$Y' = \begin{pmatrix} 0 & 0 & 1 & 1 & 1 & 0 & 0 & 0 \\ 0 & 0 & 0 & 0 & 0 & 1 & 1 & 1 \end{pmatrix}$$

$$Z4 = \begin{pmatrix} 1 & 0 & 0 & 0 & 1 & 1 & 0 & 0 \\ 0 & 1 & 0 & 0 & 1 & 1 & 1 & 1 \\ 0 & 0 & 1 & 0 & 1 & 1 & 0 & 1 \\ 0 & 0 & 0 & 1 & 1 & 0 & 1 & 1 \end{pmatrix}$$

$$G4(D) = \begin{pmatrix} Z'(D) \\ Z4 \end{pmatrix}$$

DATA TRANSMISSION SYSTEM EMPLOYING A COMBINATION OF BLOCK ENCODING AND CONVOLUTION ENCODING FOR ERROR PROTECTION

BACKGROUND OF THE INVENTION

The invention relates to a system for transmitting data words from a transmitting station to a receiving station, wherein redundancy bits are added for protection against bit errors arising in the transmission. With increasing bit rates, and generally noisy transmitting media, various error protection systems have been proposed.

DESCRIPTION OF THE RELATED ART

An example of such a system is described in U.S. Pat. No. 4,312,070 to Coombes et al, which relates to a digital data processing system for use in a mobile trunked dispatch communication system. The system of the present invention is generally applicable to data communication systems wherein communication between stations is subject to burst error phenomena, and each transmitted data word comprises more significant bits and less significant bits. In such situation a higher effective level of reliability can be attained if the more significant bits are better protected than the less significant bits. Such situation typically occurs in audio transmission, notably speech transmission, where errors in the less significant bits make the speech less agreeable or somewhat difficult to understand but an error in a more significant bit can easily make the speech completely uncomprehensible. The transmitting medium may be a broadcast medium, or also, for example, a data communication line, or a storage medium, such as magnetic tape.

A burst refers to a series of channel bits wherein the error probability is relatively high. Outside a burst the error probability is relatively low, and the chance for an error to occur is usually independent of any other non-burst errors. Therefore, these errors are called random errors. A burst, which is subject to a high error rate, is caused by only partially understood phenomena which during an interval of time degrade the channel reliability, such as thunderstorms, or movement of the transmitting or receiving station. Especially in mobile radio systems the presence of high-rise buildings also may influence the channel properties. The burst error rate may be for example, $10^{-1}$, the random error rate $10^{-3}$ or less.

SUMMARY OF THE INVENTION

It is an object of the present invention to provide improved encoding which, among other things, provides a high coding efficiency (high rate), allows for easy decoding, gives an increased protection level of more significant bits with respect to less significant bits in a data word, and furthermore allows for matching the error correction capability to the expected burst length.

Such object is realized according to the invention by a system for transmitting data words each comprising a sequence of bits of successive significance levels, such system comprising a transmitting station and a receiver station interconnected by a transmitting medium, the transmitting station comprising an encoder system for encoding data words by means of redundancy bits. Such encoder system comprises a first encoder which by matrix multiplication block encodes a set of less significant bits of each data word into a first proto-codeword, and also a second encoder which by further matrix multiplication block encodes the remaining, more significant, bits of each data word into a set of n further proto-code words. The second encoder further comprises delay elements for imparting respective different delays to the further proto-code words relative to the recurrence times of successive data words, and also comprises modulo-two adding means for bitwise adding the first proto-code word and n further proto-code words, the latter being derived from as many different data words, thereby convolution encoding the more significant bits. The output of the modulo-two adding means is supplied to the transmitting medium for transmission to the receiver station.

In certain preferred embodiments the number n may be 3, and from each each data word the two most significant bits are encoded by what effectively is a convolutional type encoding. It was found that in this way appreciable error protection could be obtained at only a limited cost of apparatus requirements.

The invention also relates to a transmitter and a receiver for use in such systems. The error protection in a mobile radio system can be provided in both directions, i.e. from a mobile station to a fixed base station, and also in the reverse direction. However, in the latter situation, other factors can also increase the communication reliability, such as increasing the power level transmitted or the antenna configuration. These two measures often are not feasible for applying to a mobile station. The decoding at the received is preferably effected by Viterbi decoding, which is a special kind of maximum likelihood decoding. The Viterbi metric denotes the total incured amount of deviation from the "true" solution, and which thus must be minimized. It is determined from the deviation between the reconstructed contribution stemming from the less significant bits of the code word, and the actually received contribution from those less significant bits.

BRIEF DESCRIPTION OF THE FIGURES

The invention is further explained by reference to the following Figures, in which.

DESCRIPTION OF A PREFERRED EMBODIMENT OF AN ENCODER SYSTEM

Figures 1, 3A, 3B:
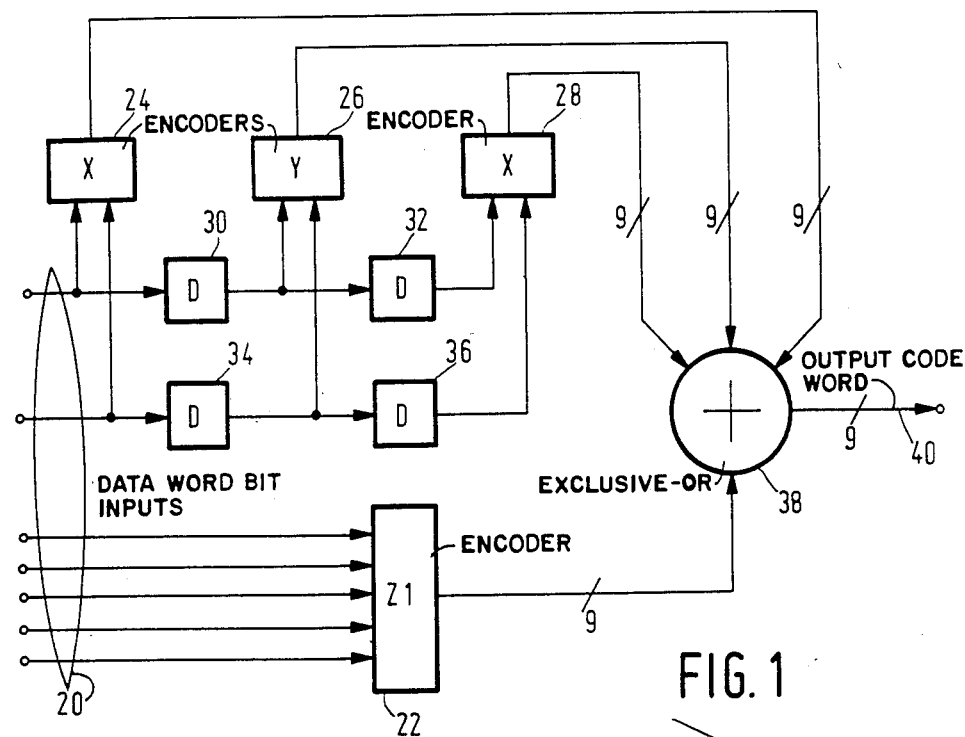
FIG. 1 is an elementry block diagram of an encoder system.
FIGS. 3a–3b show a second set of code generator matrices.

In the following, only the encoding and decoding aspects of the system are considered. The remainder, such as modulating and demodulating the code bits to derive channel bits, the physical realization of the channels, the various fields of use of the invention besides mobile telephony, and the construction of the stations and their respective data processing subsystems are ignored, as not relating to the invention proper. FIG. 1 is an elementary block diagram of an encoder system for a (9, 7) convolutional code. Input 20 receives the seven data bits of a data word in parallel. Element 22 is an encoder for deriving a block protocode word, which becomes part of a convolutional code word. In this block code, the five less significant bits of the input seven bit data word are encoded by means of matrix multiplication to form a nine bit proto-code word. In itself, matrix multiplication is a conventional technique. Moreover, there are only $32=2^5$ different values of the five data bits and therefore, a five bit input, nine bit output programmable logic array would be sufficient. Other types of read-only storage arrays would function equally well. The two most significant bits are entered into encoder 24 which has a two bit wide input, nine bit wide output. Similar technology can be used as for encoder 22. However, due to the very low number of input leads, encoder 24 can also be realized by known wild logic or semicustom cellular logic circuits.

Elements 24, 26, 28 are further encoders which by matrix multiplication generate further nine bit proto-code words from the two most significant bits of the input data word. Notably, element 28 has exactly the same algorithmic structure as element 24; note the indication X in both. Specifically, it has been found that this equality is an advantageous realization; however, it is not a necessary requirement.

Elements 30, 32, 34, 36 are delay elements. In their simplest form the delay incurred is equal to the interval between the presentation of successive data words to input 20. Therefore, the coexistent proto-code words at the outputs of elements 24, 26, 28 relate to data words of zero one, and two, respectively, positions earlier in the sequence of data words. Convolutional encoding of these proto-code words of nine bits each is realized by applying them to inputs of an EXCLUSIVE-OR-element 38. Here, all bits of corresponding significance levels in the proto-code words are added modulo-2, to produce a final nine bit code word on output 40. Parallel to serial conversion at output 40 has been omitted for brevity.

An alternative set-up to FIG. 1 would be to combine encoders 24, 28 (since they implement identical matrix multiplications) and to replace the delay elements 32, 36 by a corresponding delay introduced at the output of the encoder 24. This represents a trade off between leaving out decoder 28 and delay elements 32, 36, versus introducing a then necessary delay of a further proto-code word (nine bits) over two word intervals.

In FIG. 1 the operation of the delay elements and possibly of the further elements therein may be synchronized by a clock system. For brevity, this has not been shown.

DESCRIPTION OF EXEMPLARY CODES

Figure 2A:
FIGS. 2a–2d show a first set of code generator matrices.
Figure 2B:
Figure 2C:
Figure 2D:

FIG. 2a–2d show a first set of code generator matrices. FIG. 2a shows the matrices X, Y and Z1 implemented in encoders 24/28, 26 and 22 of FIG. 1. FIG. 2d shows the combined code generator matrix which results in the final code word at output 40. The dimensions of the combined generator matrix are seven rows of nine columns. The "D" symbolizes the delay operator, with a length of one data word recurrence time. The powers of D symbolize delays by one and two data word recurrence times, respectively, realized by delay elements 30–36. If all delays were doubled, the exponents of D would be doubled.

Next the minimum distance profile is presented, which for the less significant bits is (3 0 . . . ). The first integer should be always be non-zero and represents the minimum distance for the individual code word. Thus, the code is single bit error correcting. The further zeroes indicate that upon erasure of a code word, no further information on these less significant bits exists. The minimum distance profile for the more significant bits is (6 4 2 0 . . . ). The first integer is the minimum distance if no erasured code word occurs in a sequence of three successive code words. Thus the code is double bit error correcting and triple bit error detecting. If one code word in a sequence of three words is erased, the minimum distance is 4: single bit error correcting, double bit error detecting. If two code words of a sequence of three are erased, the minimum distance is 2: single bit error detection. If three or more successive code words are erased, no further information on these more significant bits exists.

The improved error protection of the more significant bits allows for an additional feature to be realized by the invention in that these more significant bit positions may be used to transfer data bits, for example as derived from calculations or digital coding of characters. In that case the less significant bits are preferably represented by trailing zeroes or other valued non-significant bits.

FIG. 2b shows a further generator matrix Z2 that can be used in lieu of matrix Z1, of FIG. 2a, the matrices X and Y retaining their respective functions. The first row of Z2 is produced by adding the first and third rows of matrix Z1. The second row of matrix Z2 is produced by adding the second and third rows of matrix Z1. The third and fourth rows of matrix Z2 are equal to the fourth and fifth rows, respectively, of matrix Z1. This effective suppressing of a row in a generator matrix is conventionally called "expurgation" of a code. In this way a (9, 6) code is realized. For the more significant bits the same minimum distance profile is realized as for the earlier code. For the less significant bits a minimum distance of 4 is realized now: single bit error correction, double bit error detection.

FIG. 2c shows a further generator matrix Z3 that can be used in lieu of matrices Z1, Z2 of earlier Figures. The first five columns of Z3 are identical to the first five columns of Z1. The sixth column of matrix Z3 is produced by adding and inverting all columns six through nine of matrix Z1. The seventh and eighth columns of matrix Z3 are identical to the eighth and seventh columns of matrix Z1, respectively. Furthermore, the first column of the matrix $X+DY+D^2X$ is left out to get G3 in the same way as G1, G2 herebefore. This leaving out of a column is conventionally called "puncturing" of a code. In this way an (8, 7) code is defined by G3. The minimum distance profile for the more significant bits is (3 2 1 0 . . . ): this gives: single bit error correction, double bit error detection, single bit error detection, and no error detection, respectively. However, even with two code words out of three erased, the data content of the more significant bits can be salvaged if no further error occurs. For the less significant bits the minimum distance is (2 0 . . . ): single bit error detection.

FIGS. 3a, 3b show a second set of code generator matrices. Herein, matrix Z4 is derived from matrix Z1 by omitting both the first row and the first column. Matrix X' is derived from matrix X by omitting the first column and inverting the second row. Matrix Y' is derived from matrix Y by omitting the first column and by inverting both rows. The matrix Z'(D) is derived from matrices X', Y' in the same way as matrix Z(D) from matrices X, Y. The (8, 6) code generated by matrix G4(D) is of course generated by puncturing. The (8, 6)

code so generated has therefore the same minimum distance profile as the (9, 7) code described earlier; the later having a higher efficiency (rate).

The respective codes explained hereinbefore can be generated by similar apparatus to that shown in FIG. 1, the differences being represented by the entries in the generating matrices. Furthermore, the codes disclosed are intended to be exemplary. It should be clear that other combinations of block codes can and convolution codes be used to realize the advantageous unequal error protection level in a data stream as described. Therein, data rate, code word length, and amount of protection realized should be matched to the specific requirements of the case. Notably, the number of terms in the first row of FIG. 2d should be higher for better protection of the more significant bits against longer error burst lenths.

GENERAL DESCRIPTION OF DECODING

The preferred decoder to be used in the receiver of the invention is of the general Viterbi decoder type. A tutorial paper thereon has been published by G. David Forney, Proceedings of the IEEE, Vol. 61, No. 3, March 1973, pages 268-278. Applications of Viterbi decoding are, in addition to error correcting convolutional coding, also: interference between neighbouring data symbols in an information stream, continual phase shift keying (FSK) and text recognition. Each data word represents a path in the so-called "trellis" of Viterbi, said path having a beginning and an end. The path consists of a number of intervals and each interval has an associated partial metric. The sum of the partial metrics of a path constitutes the metric or general attribute number, and the intention is to find the path with the lowest value of the overall metric. In principle the path progresses together with the incoming stream of channel or code bits, so that continually row intervals have to be taken into account. In this progress paths may split and also reunite; in the latter case only the lowest one of the associated metric values is considered further. The Viterbi decoder is therefore an example of a "maximum likelihood decoder": which tries to find the most probable information content of the code stream received.

For evaluating the codes used herein the following property is defined: if the degree of the j-th row of an encoder matrix G(D) is called $m_j$, then the complexity M(G(D)) is the row-wise sum of these degrees. In the elementary cases considered hereinbefore, the highest degree of D was always equal to 2, and therefore, the complexity of all encoder matrices is equal to 4. This parameter M is important because the associated Viterbi decoder has a hardware-complexity that is strongly related to $2^{M(G(D))}$. Thus for each increase of M by one, the necessary hardware roughly doubles.

Figure 4:
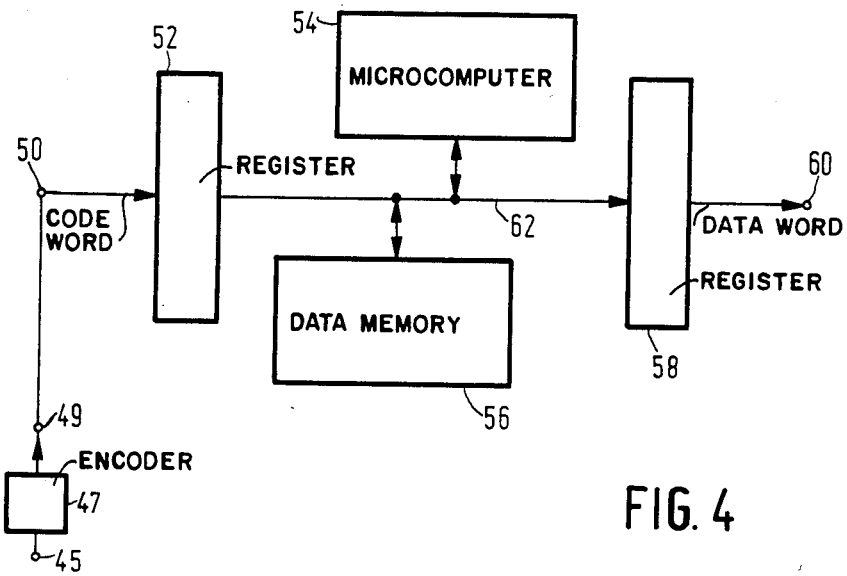
FIG. 4 is an elemntary block diagram of an encoder/decoder system.

Now, FIG. 4 gives an elementary block diagram of an encoder/decoder system, wherein the encoder is only shown as block 47. On input 45 user data input in the form of data words. At output 49 a sequence of code words is produced. Between output 49 and decoder input 50 the transmitting medium 48 is present. Now, for the decoder, in view of the extensive amount of back-tracking in a Viterbi process advantageously a programmed microcomputer is used. Furthermore, as explained supra, the decoding often need only be effected in a base station and the incurred costs of such a complicated arrangement are relatively small. The code considered is the one of FIG. 2a. The nine bit code words are received on input 50. Serial-to-parallel conversion has been omitted for bevity. Code words are transiently stored in register 52. Element 54 is a data processing element, for example, a stored program microcomputer. Element 56 is a local memory for storing all kinds of intermediate information. Element 58 is a register for transiently storing a decoded data word. These are presented to a user on output 60. Digital to analog conversion, e.g. of speech data, has been omitted for brevity. Element 62 is a bus, interconnecting elements as indicated for routing data between those elements.

The decoding process generally is preferably executed as follows. First, the more significant data bits are decoded by Viterbi decoding. Thus, the Viterbi trellis is built up completely as based on the respective possible, but unkown, values of those data bits. Next, the Viterbi metric is determined as by the weight of the deviation between the reconstructed contribution of the less significant data bits to the code word, and the actually received contribution therefrom. The optimized Viterbi metric, determining the path to be followed, gives the referred predecessor to the actual state and the sequence of preferred predecessors will finally yield the predecessor giving the lowest value of the accumulated weights. Finally, after the most likely contents of the more significant data bits are retrieved, the less significant data bits are decoded, and if necessary and considered feasible, corrected, while in certain cases an additional signalization of remaining errors may occur.

SPECIFIC DESCRIPTION OF DECODING

For the decoding, any present state of the decoder is considered as being given by two successive pairs of values of the more significant data bits. Earlier states are non-determinative, as the first row of matrix Gi (FIG. 2d) has only three terms. Note that in case the number of more significant bits were different, each state would have different k-tuples (k is the number of more significant bits). Therefore, in the trellis used for the decoding at any time instant sixteen states ($2^M$) are associated. Any of these sixteen states has four predecessors and four successors, each of these being given by an associated value pair of the more significant data bits in question. A state at instant (t−1) is specified by the fourtuple of information bits: a1(t−2), a2(t−2), a1(t−1), a2(t−1). At instant t the two last of these four binary digits take the places of the first two ones and two new digits a1(t) and a2(t) take the places of the two last binary digits. This specifies the new state a(t). To the transmission a(t−1)→a(t) corresponds a partial specification c(t) of that part of the code word determined by the convolutional encoding of the more significant data bits: $u(t)=c(t)+b(t)$. Therein, the nine bit vector c(t) is the contribution of the first two rows of the generator matrix Gi(D) to the code word. In other words, it represents the "convolutional component" of the code word u(t). The vector b(t) is the contribution of the last k−2 (i.e. 4 or 5, respectively) rows of the generator matrix Gi(D) to the code word u(t). In other words, it represents the "block code component" of the code word u(t). Now, the convolutional component of the code word only depends on the transition a(t−1)→a(t). The block component only depends on the actually produced (k−2)-tuple a3(t) . . . ak(t) of information bits at time t.

The decoding now proceeds as follows: the decoder receives an n bit vector v(t) that is a noisy version of the nominal code word (vector) u(t). First, we decode for any possible transition a(t−1)→a(t), the vector v(t)-c(t)(a(t−1),a(t)) determined by this transition, into a decoded estimate b(t) of the block code part generated by $Z_i$. There are 64 possible transitions. To each decoded quantity a "weight quantity" is associated. The choice depends on the actual Hamming distance between v(t)-c(t) and b(t)' and also on the channel characteristics. Two extreme cases are the following:

(a) the transmission channel is pure memoryless at the bit level, which means that the transition probability from a code bit value to any erroneous bit value is independent on the actual outcome of this probabilistic process for any other bit transmitted in the same code word or in any code word transmitted earlier. In that case the weight is chosen as the Hamming distance between v(t)−c(t) and b(t)'. Thus, the value of this weight varies linearly with the Hamming distance.

(b) the channel is a pure word channel, which means that within a code word either no errors occur or the word is completely random. In this situation, the weight is assigned the value 0 if b(t)' and v(t)−c(t) coincide and if not, it is assigned the value 1.

There are intermediate cases, but these are not discussed for brevity. Herein, generally, for low values of the Hamming distance, the weight should vary linearly with this distance, while for higher, a certain asymptotic value is reached for the weight quantity.

The Viterbi decoder at time t operates on the following objects:

(a) a 16-tuple W, having components W(a) that are indexed by the earlier discussed 16 states "a" of the preceding layer in the decoding trellis. The content of any W(a) is the minimum weight necessary for reaching the state "a" at time (t−1) from still earlier states.

(b) a set of N (N to be discussed infra) of 16-tuples p(t−i), with i=1, 2 ... N. The 16 elements p(t-i)(a) of p(t−i) are also indexed by the sixteen states "a" of a layer in the decoding trellis. The element p(t-i)(a) contains the "preferred predecessor" of present state "a" at time (t−1), that is the predecessor of "a" in the minimum weight path leading to "a".

(c) a further set of N 16-tuples b(t−i); (i<1 .. N). The sixteen elements b(t−i)(a) of b(t−i) are also indexed by the 16 states a of a layer in the decoding trellis. The element b(t−i)(a) contains the estimate of the "block code component" for the information transmitted at instant (t-i) under the condition that the state reached is a.

At time t the decoding is executed as follows. First the decoder estimates the information transmitted at time (t−N); N to be specified. To do that, the decoder picks an arbitrary state a(t−1) in the layer of the trellis associated with instant (t−1) and it computes successively while back tracking:

$$a*(t-2)=p(t-1)(a(t-1))$$

(here, p contains the predecessor)

$$a*(t-3)=p(t-2)(a*(t-2))$$

and so on, until $$a*(t-N-1)=p(t-N)(a*(t-N)).$$

The pair (a*(t−N−1), a*(t−N)) gives the estimated value of c'(t−N) of the conventional component c(t−N) of the code word u(t−N), and b(t−N)(a*(t−N)) gives the estimated value of the block code component b'(t−N) of the code word u(t−N).

The second step of the decoding is to update the 16-tuples referred to above. The updating of W is a classical problem in Viterbi decoding. Solution is known, and for brevity no further discussion is given. It should be noted that at each updating a certain positive quantity may be subtracted from each of these components, in order to keep them sufficiently small (one solution is to take the smallest component as this quantity). Furthermore, the decoder produces two 16-tuples p(t) and b(t) at time t. The oldest (least recently developed) 16-tuples p(t−N) may be discarded, while the remaining 16-tuples are all shifted one position in the time hierarchy.

Figure 5:
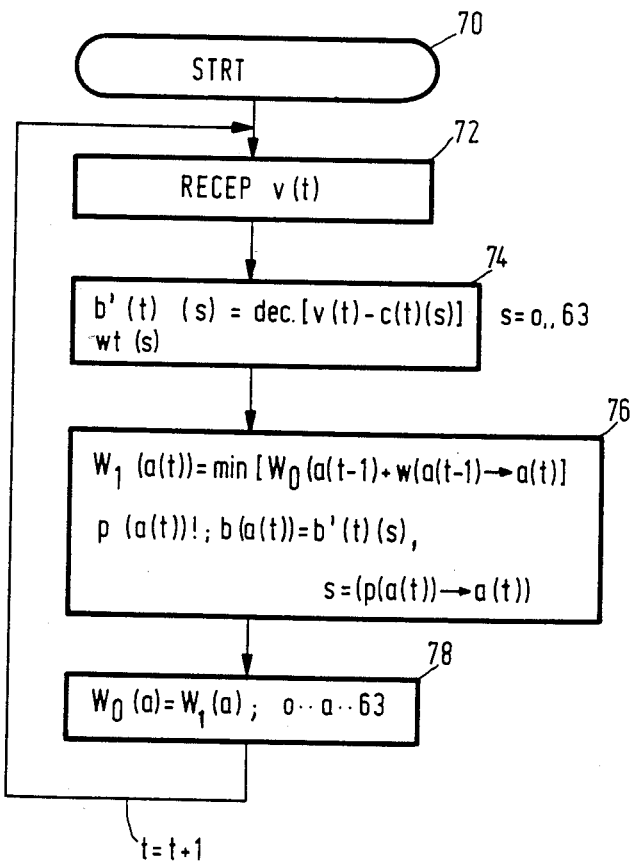
FIG. 5 is an elementary flow diagram of the decoding process.

By way of summarizing, FIG. 5 gives an elementary flow diagram of the decoding process.

In block 70 the process is started, for example by initializing the relevant address counters and clearing the data memory. In block 72 the next nine bit code word is received. In block 74 for each S from 0 through 63, S being the index of the various transition possibilities, the contribution of the convolutional part is put forward, the contribution of the block part is extracted from the code word, and compared with the actually received contribution, while also the weight of the difference is determined. In block 76 for each a(t), a(t) being the index of a state, the minimum value of the incremented weight as varying over the four predecessors of state a(t) is determined. The p(a(t)) is the preferred predecessor, and b(a(t))=b'(t)(S) if the system goes from p(a(t)) to a(t). Thus the index S is known. In block 78 for each S the minimum value of the incremented weight is saved, and also the now known ultimately preferred predecessors a(t−N) is outputted. From this information, the less significant data bits are calculated in known block code decoding manner. The result may be, according to the block code protection in case, a corrected (k−2)-tuple, or a (k−2)-tuple detected to be in error. Finally, the value of t is incremented and the system goes back to block 72.

If we assume that transmission of one word takes 0.5 msec. and the decoding delay may be 20 msec., then the value of N may be about 40. Note that a delay of 20 msec. in the transmission of speech is not considered as a subjective nuisance. However, for certain reasons (as an additional protection against a sequence of word-burst errors), it could be considered usefull to introduce an interleaving scheme (interleaving itself is well known and not related to gist of the present invention). An interleaving degree of 3 or 4 on the level of the code words leads to a value of N which thus is 3 to 4 times smaller than the earlier value of 40. Of course, other bounds for the decoding delay would be valid in specific cases.

The choice between the several codes proposed may depend on several criteria. It should be noted that the (8, 6) code generated by G4(D) has several advantages as here 8 bit quantities are transmitted, whereas 8-bit microprocessor systems are widely used. Each byte transferred in the decoder may therefore be used to store two informations of four bits each time. This is exactly the place necessary to store a pair (p(t−i)(a), b(t−i)(a)) since both quantities need four bits. However, some part of this information is contained already in the index a, specifying the associated component of p(t−i). Since each state here has only four predecessors, only two bits are necessary to store the estimates p(t−i)(a).

It is clear that the proto-code word for the less significant bits should have at least a minimum Hamming distance of two for those less significant bits if this proto-code word is only used once. On the other hand, this latter proto-code word could also be used twice for generating as many final code words. It is not necessary that all proto-code words have exactly the same bit length. Also, the data word may be split into three or more parts, the protection of the more significant part(s) always being greater than the protection of the less significant part(s).

What is claimed is:

1. A transmission system for successive data words each comprising a sequence of bits of successive levels of significance, such transmission system comprising a transmitting station and a receiving station interconnected by a transmission medium, said transmitting station comprising an encoder system for redundantly encoding each of such successive data words with redundancy bits; characterized in that said encoder system comprises:

a first encoder which by matrix multiplication encodes a set of less significant bits of each such successive data word into a first proto-code word;

a second encoder which by further matrix multiplication encodes the remaining more significant bits of each data word into a set of "n" further proto-code words, such second encoder comprising a plurality of delay elements for imparting respective different delays to said further protor-code words, such delays being in multiples of the recurrence times of the successive data words; and modulo-two adding means connected to said first and second encoders for bitwise adding said first proto-code word and said "n" further proto-code words, such "n" further proto-code words corresponding to "n" different data words, so as to derive a final code word having an extended bit length with respect to the bit length of a data word and which comprises a block code of the less significant bits of a data word and a convolutional code of the more significant bits of such data word, said modulo-two adding means having an output connected to said transmission medium.

2. A receiving station for receiving code words from a transmitting station in a system as claimed in claim 1, comprising:

Viterbi decoding means for decoding all relevant possible states of more significant bits of the "n" transmitted data words contributing to a received code word;

means connected to such decoding means for determining respective deviations between a reconstruction of the contribution of less significant bits to a received code word and the actual contribution of such bits to such received code word;

means connected to shch deviation determining means for determining, from said deviations, preferred predecessor states to the actual state of the more significant bits of such received code word;

means connected to said predecessor determining means for chaining sequences of such preferred predecessor states up to a length of N such states;

means connected to said chaining means for selecting from such sequences an optimum predecessor state of a data word located N data words prior to the data word corresponding to a received code word; and means connected to said selecting means for reconstructing the less significant data bits of such optimum predecessor data word.

3. A system as claimed in claim 1, wherein n=3, and wherein said delays are respectively zero, one, and two times said recurrence times of successive data words.

4. A system as claimed in claim 3, wherein the zero delayed further proto-code word is identical to the further proto-code word which is delayed by two recurrence times.

5. A system as claimed in claim 3, characterized in that the first further proto-code word encoded from any data word is identical to the third further proto-code word encoded from such data word.

6. A transmitting station for use in a system as claimed in claim 1, characterized in that said more significant bits consist of two data bits per data word.

7. A transmitting station for use in a system as claimed in claim 1, characterized in that it comprises means for substituting dummy bits in lieu of said less significant bits of a data word.

* * * * *